(12) United States Patent
Wang et al.

(10) Patent No.: US 8,772,873 B2
(45) Date of Patent: *Jul. 8, 2014

(54) GE-ON-INSULATOR STRUCTURE AND METHOD FOR FORMING THE SAME

(75) Inventors: Jing Wang, Beijing (CN); Jun Xu, Beijing (CN); Lei Guo, Beijing (CN)

(73) Assignee: Tsinghua University, Beijing (CN)

( * ) Notice: Subject to any disclaimer, the term of this patent is extended or adjusted under 35 U.S.C. 154(b) by 357 days.

This patent is subject to a terminal disclaimer.

(21) Appl. No.: 13/201,903

(22) PCT Filed: Jul. 27, 2011

(86) PCT No.: PCT/CN2011/077703

§ 371 (c)(1),
(2), (4) Date: Aug. 17, 2011

(87) PCT Pub. No.: WO2012/100519

PCT Pub. Date: Aug. 2, 2012

(65) Prior Publication Data

US 2012/0187487 A1    Jul. 26, 2012

(30) Foreign Application Priority Data

Jan. 24, 2011    (CN) .......................... 2011 1 0025618

(51) Int. Cl.
| | | |
|---|---|---|
| H01L 27/12 | (2006.01) | |
| H01L 21/336 | (2006.01) | |
| H01L 29/786 | (2006.01) | |
| H01L 21/28 | (2006.01) | |
| H01L 21/762 | (2006.01) | |
| H01L 29/66 | (2006.01) | |

(52) U.S. Cl.
CPC .... *H01L 29/78684* (2013.01); *H01L 29/78603* (2013.01); *H01L 21/28255* (2013.01); *H01L 21/76256* (2013.01); *H01L 29/66742* (2013.01)

USPC .................. 257/347; 257/192; 257/E21.112; 257/E21.409; 438/285; 438/151

(58) Field of Classification Search
CPC .................. H01L 21/26506; H01L 21/02381; H01L 31/101; H01L 29/66742; H01L 21/76256

See application file for complete search history.

(56) References Cited

U.S. PATENT DOCUMENTS

| | | | |
|---|---|---|---|
| 5,306,386 A | 4/1994 | De Lyon | |
| 2005/0042842 A1 | 2/2005 | Lei et al. | |
| 2007/0170541 A1* | 7/2007 | Chui et al. | 257/506 |
| 2008/0185618 A1* | 8/2008 | Chu et al. | 257/292 |
| 2008/0268615 A1* | 10/2008 | Allibert et al. | 438/455 |
| 2009/0114902 A1* | 5/2009 | Bai et al. | 257/18 |
| 2010/0052104 A1 | 3/2010 | Signamarcheix et al. | |
| 2010/0065886 A1* | 3/2010 | Kamata et al. | 257/192 |
| 2012/0007146 A1 | 1/2012 | Wang et al. | |

FOREIGN PATENT DOCUMENTS

| | | |
|---|---|---|
| CN | 101292342 A | 10/2008 |
| CN | 101292343 A | 10/2008 |
| CN | 101882624 A | 11/2010 |
| WO | 2007025566 A1 | 3/2007 |

* cited by examiner

*Primary Examiner* — William F Kraig
*Assistant Examiner* — Pavel Ivanov
(74) *Attorney, Agent, or Firm* — Hodgson Russ LLP

(57) ABSTRACT

A method for forming a Ge-on-insulator structure is provided, comprising steps of: forming a Ge layer (1200) on a substrate (2000); treating a first surface of the Ge layer (1200) to form a first semiconducting metal-germanide passivation layer (1300); bonding the first semiconducting metal-germanide passivation layer (1300) with a silicon substrate (1100), wherein on a surface of the silicon substrate (1100) an oxide insulating layer is formed; and removing the substrate (2000). Further, a Ge-on-insulator structure formed by the method is also provided.

14 Claims, 3 Drawing Sheets

GE-ON-INSULATOR STRUCTURE AND METHOD FOR FORMING THE SAME

CROSS-REFERENCE TO RELATED APPLICATIONS

This patent application is a §371 national stage patent application based on International Patent Application No. PCT/CN2011/077703, filed Jul. 27, 2011, entitled "GE-ON-INSULATOR STRUCTURE AND METHOD FOR FORMING THE SAME," which claims priority to Chinese Patent Application Number 201110025618.X, filed on Jan. 24, 2011, which are both incorporated herein by reference in their entirety.

FIELD

The present disclosure relates to a semiconductor manufacture and design, and more particularly to a GeOI (Ge-on-insulator) structure and a method for forming the same.

BACKGROUND

For a long time, a feature size of a metal-oxide-semiconductor field-effect transistor (MOSFET) is scaled down according to Moore's law, and a working speed of the MOSFET is faster and faster. However, physical and technical limits of Si materials have been reached. Therefore, in order to improve a performance of the MOSFET, various methods have been proposed, and consequently a More-than-Moore era has come. Among them, an effective technology is a high-mobility channel engineering based on heterogeneous materials, particularly, high-carrier-mobility materials such as Si-based Ge materials. For example, one high-hole-mobility Si-based Ge material is a GeOI structure formed by directly bonding Ge and a Si wafer having a $SiO_2$ insulating layer, which has good application perspective.

A conventional GeOI structure is formed by directly bonding Ge and insulation oxides such as $SiO_2$, or formed by forming $GeO_2$ on Ge and then bonding Ge and a silicon wafer. The defects lie in that, if a Ge layer is directly formed on an insulation oxide substrate, because an interface between the Ge materials and the insulation oxides is poor, particularly, an interface state density is very high, serious scattering and leakage may be caused, thus influencing a performance of a device.

SUMMARY

The present disclosure is aimed to solve at least one of the above mentioned technical problems, particularly a defect of poor interface state between Ge and an oxide insulator in a conventional GeOI structure.

According to an aspect of the present disclosure, a method for forming a Ge-on-insulator structure is provided, comprising steps of: forming a Ge layer on a substrate; treating a first surface of the Ge layer to form a first semiconducting metal-germanide passivation layer; bonding the first semiconducting metal-germanide passivation layer with a silicon substrate, wherein on a surface of the silicon substrate an oxide insulating layer is formed; and removing the substrate.

In one embodiment, the method further comprises: after the substrate is removed, treating a second surface of the Ge layer to form a second semiconducting metal-germanide passivation layer.

In one embodiment, the method further comprises: forming a gate dielectric layer on the second semiconducting metal-germanide passivation layer; forming a gate electrode on the gate dielectric layer; and forming a source and a drain in the Ge layer.

In one embodiment, the method further comprises: after the substrate is removed, treating a second surface of the Ge layer to form a $Ge_{1-x}Si_x$ passivation layer, wherein x is within a range from 0 to 1.

In one embodiment, the metal is at least one metal selected from a group consisting of strontium, barium or stannum.

In one embodiment, the Ge layer is a strained Ge layer, a strained $Ge_{1-y}Si_y$ layer, a relaxed Ge layer or a relaxed $Ge_{1-y}Si_y$ layer, wherein y is within a range from 0 to 1.

According to another aspect of the present disclosure, a Ge-on-insulator structure is provided, comprising: a silicon substrate, wherein on a surface of the silicon substrate an oxide insulating layer is formed; and a Ge layer formed on the silicon substrate, wherein a first semiconducting metal-germanide passivation layer is formed between the Ge layer and the silicon substrate.

In one embodiment, the Ge-on-insulator structure further comprises: a second semiconducting metal-germanide passivation layer formed on the Ge layer.

In one embodiment, the Ge-on-insulator structure further comprises: a gate dielectric layer formed on the second semiconducting metal-germanide passivation layer; a gate electrode formed on the gate dielectric layer; and a source and a drain formed in the Ge layer.

In one embodiment, a $Ge_{1-x}Si_x$ passivation layer formed on the Ge layer, wherein x is within a range from 0 to 1.

In one embodiment, the metal is at least one metal selected from a group consisting of strontium, barium or stannum.

In one embodiment, the Ge layer is a strained Ge layer, a strained $Ge_{1-y}Si_y$ layer, a relaxed Ge layer or a relaxed $Ge_{1-y}Si_y$ layer, wherein y is within a range from 0 to 1.

According to an embodiment of the present disclosure, because the strontium germanide layer, the barium germanide layer or the stannum germanide layer is a semiconductor layer, an interface state between Ge materials and an insulation oxide may be alleviated so as to reduce a leakage and a scattering at the interface, and a mobility of the Ge materials may not be reduced largely.

Additional aspects and advantages of the embodiments of the present disdosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
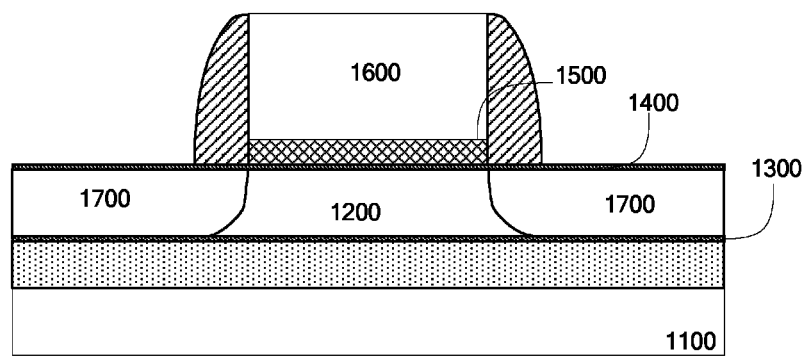
FIG. 1 is a cross-sectional view of a Ge-on-insulator structure according to an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

FIG. 1 is a cross-sectional view of a Ge-on-insulator structure according to an embodiment of the present disclosure. The GeOI structure comprises a silicon substrate 1100, on a surface of which an oxide insulating layer is formed; and a Ge layer 1200 formed on the silicon substrate 1100, in which a first semiconducting metal-germanide passivation layer 1300 is formed between the Ge layer 1200 and the silicon substrate 1100. In some embodiments, the first semiconducting metal-germanide passivation layer 1300 is a strontium germanide layer, a barium germanide layer or a stannum germanide layer formed by treating a first surface of the Ge layer 1200 using strontium, barium or stannum. In one embodiment, the first semiconducting metal-germanide passivation layer 1300 is bonded with the silicon substrate 1100. In one embodiment, the silicon substrate 1100 comprises a Si substrate and a $SiO_2$ insulating layer formed on the Si substrate. In another embodiment, the Ge layer 1200 is a strained Ge layer, a strained $Ge_{1-y}Si_y$ layer, a relaxed Ge layer or a relaxed $Ge_{1-y}Si_y$ layer and y is within a range from 0 to 1. Because the strontium germanide layer, the barium germanide layer or the stannum germanide layer is a semiconductor layer, an interface state between Ge materials and an insulation oxide may be alleviated so as to reduce a leakage and a scattering at the interface, and a mobility of the Ge materials may not be reduced largely.

In one embodiment, the GeOI structure further comprises a second semiconducting metal-germanide passivation layer 1400 formed on the Ge layer 1200. Similarly, in some embodiments, the second semiconducting metal-germanide passivation layer 1400 is a strontium germanide layer, a barium germanide layer or a stannum germanide layer formed by treating a second surface of the Ge layer 1200 using strontium, barium or stannum. In other embodiments, the second semiconducting metal-germanide passivation layer 1400 may also be formed by other methods, that is, the second semiconducting metal-germanide passivation layer 1400 may be a $Ge_{1-x}Si_x$ layer and x is within a range from 0 to 1.

In one embodiment, the GeOI structure further comprises a gate dielectric layer 1500 formed on the second semiconducting metal-germanide passivation layer 1400, a gate electrode 1600 formed on the gate dielectric layer 1500, and a source 1700 and a drain 1700 formed in the Ge layer 1200.

FIGS. 2-6 are cross-sectional diagrams of intermediate statuses of a Ge-on-insulator structure formed during a process of a method for forming the Ge-on-insulator structure according to an embodiment of the present disclosure. The method comprises the following steps.

Step S101, a substrate 2000 is provided. In some embodiments, the substrate 2000 is a Si substrate or a Ge substrate. In other embodiments, other substrates may also be used. In some embodiments, the substrate 2000 may be reused, thus reducing a fabrication cost.

Figure 2:
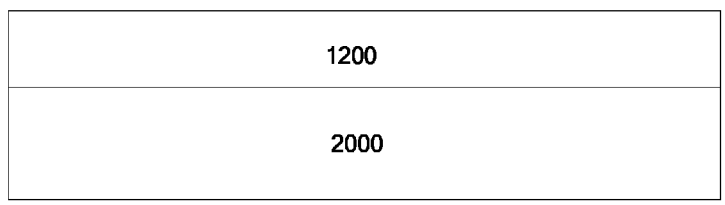
FIGS. 2-6 are cross-sectional diagrams of intermediate statuses of a Ge-on-insulator structure formed during a process of a method for forming the Ge-on-insulator structure according to an embodiment of the present disclosure.

Step S102, a Ge layer 1200 is formed on the substrate 2000, as shown in FIG. 2. In one embodiment, the Ge layer 1200 may be a strained Ge layer, a strained $Ge_{1-y}Si_y$ layer, a relaxed Ge layer or a relaxed $Ge_{1-y}Si_y$ layer and y is within a range from 0 to 1.

Figure 3:
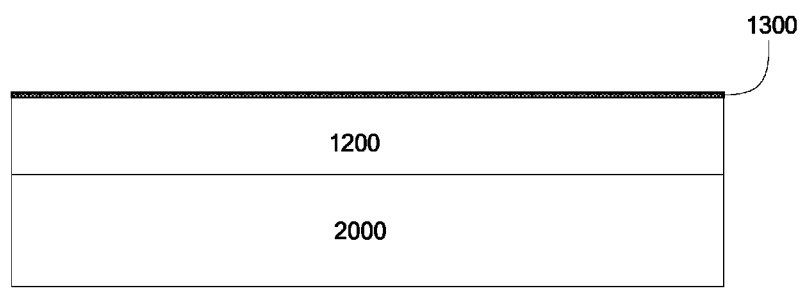

Step S103, a first surface of the Ge layer 1200 is treated to form a first semiconducting metal-germanide passivation layer 1300, as shown in FIG. 3. In some embodiments, the first semiconducting metal-germanide passivation layer 1300 is a strontium germanide layer, a barium germanide layer or a stannum germanide layer.

Figure 4:
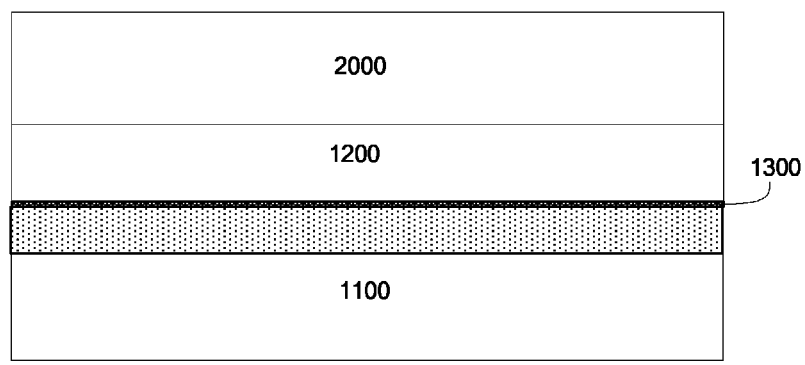

Step S104, the first semiconducting metal-germanide passivation layer 1300 is connected with a silicon substrate 1100, on a surface of which an oxide insulating layer is formed, as shown in FIG. 4. In one embodiment, the first semiconducting metal-germanide passivation layer 1300 is bonded with the silicon substrate 1100.

Figure 5:
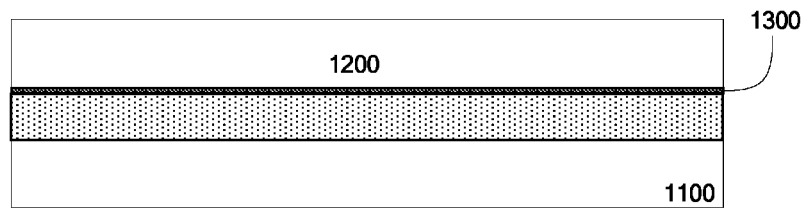

Step S105, the substrate 2000 is removed, as shown in FIG. 5.

Figure 6:
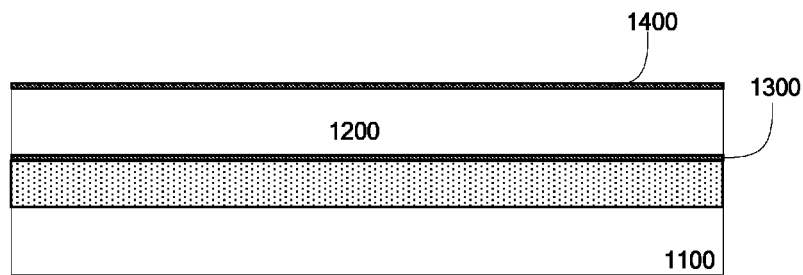

Step S106, a second surface of the Ge layer 1200 is treated to form a second semiconducting metal-germanide passivation layer 1400, as shown in FIG. 6. The second semiconducting metal-germanide passivation layer 1400 may be a strontium germanide layer, a barium germanide layer or a stannum germanide layer. Similarly, in other embodiments, the second semiconducting metal-germanide passivation layer 1400 may also be formed by other methods, that is, the second semiconducting metal-germanide passivation layer 1400 may be a $Ge_{1-x}Si_x$ layer and x is within a range from 0 to 1.

Step S107, a gate dielectric layer 1500 is formed on the second semiconducting metal-germanide passivation layer 1400, a gate electrode 1600 is formed on the gate dielectric layer 1500, and a source 1700 and a drain 1700 are formed in the Ge layer 1200, as shown in FIG. 1.

According to an embodiment of the present disclosure, because the strontium germanide layer, the barium germanide layer or the stannum germanide layer is a semiconductor layer, an interface state between Ge materials and an insulation oxide may be alleviated so as to reduce a leakage and a scattering at the interface, and a mobility of the Ge materials may not be reduced largely.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:
1. A method for forming a Ge-on-insulator structure, comprising steps of:
   forming a Ge layer on a substrate;
   treating a first surface of the Ge layer to form a first semiconducting metal-germanide passivation layer;

bonding the first semiconducting metal-germanide passivation layer with a silicon substrate, wherein on a surface of the silicon substrate an oxide insulating layer is formed; and removing the substrate.

2. The method according to claim 1, further comprising:

after the substrate is removed, treating a second surface of the Ge layer to form a second semiconducting metal-germanide passivation layer.

3. The method according to claim 2, further comprising:

forming a gate dielectric layer on the second semiconducting metal-germanide passivation layer;

forming a gate electrode on the gate dielectric layer; and forming a source and a drain in the Ge layer.

4. The method according to claim 1, further comprising:

after the substrate is removed, treating a second surface of the Ge layer to form a $Ge_{1-x}Si_x$ passivation layer, wherein x is within a range from 0 to 1.

5. The method according to claim 1, wherein the metal is at least one metal selected from a group consisting of strontium, barium or stannum.

6. The method according to claim 2, wherein the metal is at least one metal selected from a group consisting of strontium, barium or stannum.

7. The method according to claim 1, wherein the Ge layer is a strained Ge layer, a strained $Ge_{1-y}Si_y$ layer, a relaxed Ge layer or a relaxed $Ge_{1-y}Si_y$ layer, wherein y is within a range from 0 to 1.

8. A Ge-on-insulator structure, comprising:

a silicon substrate, wherein on a surface of the silicon substrate an oxide insulating layer is formed; and a Ge layer formed on the silicon substrate, wherein a first semiconducting metal-germanide passivation layer is formed between the Ge layer and the silicon substrate.

9. The Ge-on-insulator structure according to claim 8, further comprising:

a second semiconducting metal-germanide passivation layer formed on the Ge layer.

10. The Ge-on-insulator structure according to claim 9, further comprising:

a gate dielectric layer formed on the second semiconducting metal-germanide passivation layer, a gate electrode formed on the gate dielectric layer; and a source and a drain formed in the Ge layer.

11. The Ge-on-insulator structure according to claim 8, further comprising:

a $Ge_{1-x}Si_x$ passivation layer formed on the Ge layer, wherein x is within a range from 0 to 1.

12. The Ge-on-insulator structure according to claim 8, wherein the metal is at least one metal selected from a group consisting of strontium, barium or stannum.

13. The Ge-on-insulator structure according to claim 9, wherein the metal is at least one metal selected from a group consisting of strontium, barium or stannum.

14. The Ge-on-insulator structure according to claim 8, wherein the Ge layer is a strained Ge layer, a strained $Ge_{1-y}Si_y$ layer, a relaxed Ge layer or a relaxed $Ge_{1-y}Si_y$ layer, wherein y is within a range from 0 to 1.

* * * * *